US012775752B2

(12) United States Patent
Wagner et al.

(10) Patent No.: US 12,775,752 B2
(45) Date of Patent: Oct. 27, 2026

(54) ARTIFICIAL INTELLIGENCE SECURITY SYSTEM DESIGN

(71) Applicants: Bradley M. Wagner, Vienna, VA (US); John A. Halsema, Vienna, VA (US); Christopher A. Guryan, Vienna, VA (US); Richard J. Stuart, Vienna, VA (US); Blane D. Schertz, Vienna, VA (US)

(72) Inventors: Bradley M. Wagner, Vienna, VA (US); John A. Halsema, Vienna, VA (US); Christopher A. Guryan, Vienna, VA (US); Richard J. Stuart, Vienna, VA (US); Blane D. Schertz, Vienna, VA (US)

( * ) Notice: Subject to any disclaimer, the term of this patent is extended or adjusted under 35 U.S.C. 154(b) by 1076 days.

(21) Appl. No.: 17/838,521

(22) Filed: Jun. 13, 2022

(65) Prior Publication Data

US 2022/0398353 A1 Dec. 15, 2022

Related U.S. Application Data

(60) Provisional application No. 63/209,428, filed on Jun. 11, 2021.

(51) Int. Cl.
*G06F 30/13* (2020.01)
*G06F 30/20* (2020.01)

(52) U.S. Cl.
CPC .............. *G06F 30/13* (2020.01); *G06F 30/20* (2020.01)

(58) Field of Classification Search
CPC ......... G06F 30/13; G06F 30/20; G06Q 10/06; G06Q 50/265
See application file for complete search history.

(56) References Cited

U.S. PATENT DOCUMENTS

2017/0061783 A1* 3/2017 Nalukurthy .......... G08B 29/186
2019/0347366 A1* 11/2019 Krylov .................... G06F 30/20
2020/0097493 A1* 3/2020 Gawrys ................... G06F 16/48
2020/0117900 A1* 4/2020 Deng ...................... H04L 67/12

* cited by examiner

*Primary Examiner* — Chuen-Meei Gan
(74) *Attorney, Agent, or Firm* — Lanier Ford Shaver & Payne, P.C.; Jeremy A. Smith

(57) ABSTRACT

The present disclosure provides a method and a system to implement the method of using artificial intelligence to design security systems or plans for all manner of sites/locations, including high value government and commercial sites. In one embodiment, the method includes creating a digital twin (or copy) 10 of a site 20 and, using the digital twin 10, creating numerous permutations 30 of security systems 40 for the site 20 using security system design software 50 featuring artificial intelligence.

12 Claims, 1 Drawing Sheet

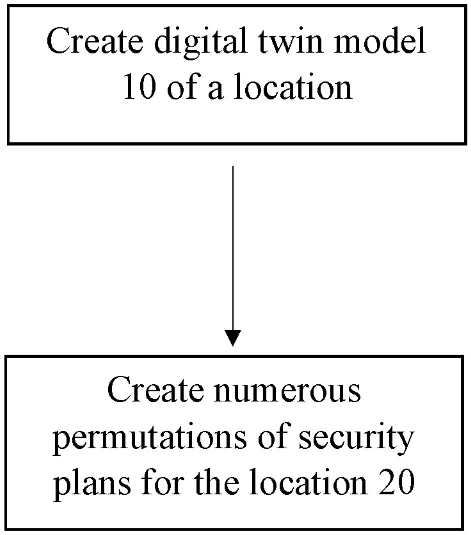
Create digital twin model 10 of a location
Create numerous permutations of security plans for the location 20

ARTIFICIAL INTELLIGENCE SECURITY SYSTEM DESIGN

CROSS REFERENCE TO OTHER APPLICATIONS

This U.S. non provisional patent application claims priority to, and the benefit of, U.S. provisional patent application No. 63/209,428 filed on Jun. 11, 2021.

FIELD OF THE DISCLOSURE

The present disclosure pertains to the field of security system design for a site.

BACKGROUND

Current methods of designing a security system are labour intensive, costly, and often fail to take into account how various security system components will interact with one another in a real-world application, including the spatial limitations, characteristics, and requirements of the specific site to be secured.

BRIEF DESCRIPTION OF THE DRAWINGS

To further illustrate the advantages and features of the present disclosure, a more particular description of the invention will be rendered by reference to specific embodiments thereof which are illustrated in the appended drawings. It is appreciated that these drawings are not to be considered limiting in scope. The invention will be described and explained with additional specificity and detail through the use of the accompanying drawings in which:

FIG. 1 shows one embodiment of the design method disclosed herein.

DETAILED DESCRIPTION

The present disclosure provides a method and a system to implement the method of using artificial intelligence to design security systems or plans for all manner of sites/locations, including high value government and commercial sites.

In one embodiment, the method includes creating a digital twin (or copy) 10 of a site 20 and, using the digital twin 10, creating numerous permutations 30 of security systems 40 for the site 20 using security system design software 50 featuring artificial intelligence.

The digital twin 10 is a 3D model of the site 20 to be secured. The digital twin 10 may feature at least one of the following buildings, fences (or other barriers), roads, terrain, gates, doors, sensors, security, and communication systems etc. present at the site 20. The digital twin 10 can be created using any number of commercially available software including Autodesk®, ESRI, and Microstation. The digital twin 10, once created, is stored in COLLADA™ file format for further processing by the security system design software 50.

The security system design software 50 can generate numerous (potentially hundreds or thousands) of security system design options for a given site 20 using Monte-Carlo/stochastic generated solutions for the site 20.

The security system design software 50 comprises a library of elements 60 important for security system 40 design, including, but not limited to elements 60 for detection of, delay of, response to and neutralization of a security threat. By way of non-limiting example, the security system design software 50 library of elements 60 for a site 20 could include information about various alarms, sensors, cameras, barriers, gates, responders, vehicles, and weapons that either are, or could be, deployed on the site 20. In addition, the security system design software has detailed information about the adversaries and defenders including weapons, armor, vehicles, breaching tools, and skill level. Using the digital twin 3D model and simulation functionality the security system design software 50 then can run, hundreds or thousands of permutations of various different security system designs based upon the specifications for each element of the design as well as each element working within a system of systems, the combination of the digital twin, security technology, weapons, adversaries and security personnel at a site. Once threats scenarios to the site 20 are baselined, thousands of modifications to the security system 40 (and the corresponding integrated defense plan) can be simulated and evaluated to improve security effectiveness while optimizing cost using the Monte Carlo simulation capability.

The security system design software 50 also allows the expected performance of the elements 60 to be captured and modeled. For example, human skill level (whether attacker or defender) is a variable factor in quickly breaching a barrier at a site 20 and the security system design software 50 allows for various levels of human skill to be modeled and to integrated with other elements 60. Another example are cameras which may work well in daylight but not as well at night or under difficult weather conditions. Likewise, by using the digital twin 10 and accounting for variances in terrain, guard operations, site layout and other spatial limitations at the site 20, element 60 positioning, such as cameras, barriers, etc. can be modeled and optimized.

The system and method allows for performance specifications of a certain element 60 to be considered when designing a security system 40 and for those specifications to be integrated into a system of systems properly. For example, the performance specifications of a certain element 60, a camera, can be accounted for within the overall design of a security system 40 through hundreds, if not thousands, of Monte Carlo simulations. The system and method therefore allows an user to determine, in detail (location and azimuth) both where to place the camera to allow it to function properly and with the most efficiency within the overall security system 40 and what additional elements 60 may be necessary to cover any potential shortfalls the camera might suffer under certain conditions where it cannot operate at its best efficiency. Therefore, the system and method also allows an user to automatically select both the best type of camera for a particular purpose and also where that camera should be placed. Of course, the camera is used for exemplary purposes and the automated location and efficiency determinations of other elements 60, such as all sensors, detectors, barriers, robotic security systems, guard force patrol routes, etc. should be considered within the scope of this disclosure.

In one preferred embodiment, the method can be outlined as follows:

1. First, model to create accurate digital twin 10 that includes roads, terrain, barriers, buildings, infrastructure, delay systems, etc.
2. Second, characterize details using the security system design software 50 library of elements 60 which include detection technology, sensors, response force, rules of engagement, adversary, vehicles, weapons, etc.

3. Third, simulate, using the Monte Carlo simulation engine to measure the capabilities of the security system design to identify, for example, the best path for each adversary to access site and create permutations of a security breach to optimize security system 50 design. The simulation is then modified and rerun allowing the system's AI routines to reoptimize against the modified input.

The method and system disclosed herein offer several key advantages over the prior art, including:

Increasing security effectiveness while reducing costs. The present disclosure allows one to analyze the interaction, or lack thereof, to achieve an outcome which provides information to make smart decisions to improve security effectiveness for a site, versus reliance on some theoretical set of performance statistics.

Allowing the security systems to be designed as a system of systems versus individual elements.

Testing of the systems "defense in depth", to identify where the systems most vulnerable failure points across a wide range of scenarios, assuring design changes are well understood under all conditions.

Allowing deployment in ways that are proven to attain the highest possible levels of security and/or cost effectiveness.

Although particular embodiments of the present disclosure have been described, it is not intended that such references be construed as limitations upon the scope of this disclosure except as set forth in the claims.

We claim:

1. A method of designing a security plan for a location having at least one of a camera, a sensor or a fence, said method comprising:

a. creating a 3D digital twin model of the location using a computer wherein the location of at least of the camera, sensor or fence is determined;

b. modeling at least one of a defender's skill level in defending the location or an attacker's variable skill level in attacking the location; and c. using the 3D digital twin model and at least one of the defender's or the attacker's skill level to create numerous permutations of the various security plans for the location to identify the most vulnerable failure point, said security plan modifying the location of at least one of the camera, sensor or fence based on the identified failure point to increase security effectiveness.

2. The method of claim 1 wherein the 3D digital twin model comprises at least one of the following: physical barriers and sensors present at the location.

3. The method of claim 2 wherein the physical barriers include at least one of the following: buildings, fences (or other barriers), roads, terrain, gates, doors.

4. The method of claim 3 wherein the physical barriers include at least two of the following: buildings, fences (or other barriers), roads, terrain, gates, doors.

5. The method of claim 1 wherein the step of creating numerous permutations of the various security plans for the location is accomplished by using a security system design software.

6. The method of claim 5 wherein the numerous permutations are generated by Monte-Carlo/stochastic generated solutions.

7. The method of claim 5 wherein the security system design software comprises a library which further comprises information about at least one of alarms, sensors, cameras, barriers, gates, responders, vehicles, and weapons that either are, or could be, present at the location.

8. A method of designing a security plan for a location having at least one of a camera, a sensor or a fence, said method comprising:

a. creating a 3D digital twin model of the location using a computer wherein the location of at least of the camera, sensor or fence is determined;

b. modeling at least one of a defender's skill level in defending the location or an attacker's variable skill level in attacking the location;

c. using the 3D digital twin model and at least one of the defender's or the attacker's skill level to create numerous permutations of the various security plans for the location to identify the most vulnerable failure point; and wherein d. generating the numerous permutations of the various security plans for the location is performed by a security system design software using Monte-Carlo/stochastic generated solutions wherein said permutations modify the location of at least one of the camera, sensor or fence to increase security effectiveness.

9. The method of claim 8 wherein the 3D digital twin model comprises at least one of the following: physical barriers and sensors present at the location.

10. The method of claim 9 wherein the physical barriers include at least one of the following: buildings, fences (or other barriers), roads, terrain, gates, doors.

11. The method of claim 10 wherein the physical barriers include at least two of the following: buildings, fences (or other barriers), roads, terrain, gates, doors.

12. The method of claim 11 wherein the security system design software comprises a library which further comprises information about at least one of alarms, sensors, cameras, barriers, gates, responders, vehicles, and weapons that either are, or could be, present at the location.

* * * * *